United States Patent
Sourjko et al.

(10) Patent No.: US 8,051,395 B2
(45) Date of Patent: Nov. 1, 2011

(54) METHOD OF LABELLING SWAPPABLE PINS FOR INTEGRATED CIRCUIT PATTERN MATCHING

(75) Inventors: Sergei Sourjko, Gatineau (CA); Vyacheslav Zavadsky, Ottawa (CA)

(73) Assignee: Semiconductor Insights Inc., Kanata, Ontario (CA)

( * ) Notice: Subject to any disclaimer, the term of this patent is extended or adjusted under 35 U.S.C. 154(b) by 677 days.

(21) Appl. No.: 12/153,320

(22) Filed: May 16, 2008

(65) Prior Publication Data

US 2009/0119623 A1    May 7, 2009

(30) Foreign Application Priority Data

Nov. 7, 2007   (CA) ..................................... 2609691

(51) Int. Cl.
*G06F 17/50*   (2006.01)

(52) U.S. Cl. ......... 716/100; 716/106; 716/111; 716/132

(58) Field of Classification Search .......... 716/100–108, 716/111, 132
See application file for complete search history.

(56) References Cited

U.S. PATENT DOCUMENTS

| 6,167,556 | A  | * | 12/2000 | Sun et al. ...................... 716/3 |
| 6,988,253 | B1 | * | 1/2006  | Lipton et al. ................ 716/112 |

* cited by examiner

*Primary Examiner* — Paul Dinh
(74) *Attorney, Agent, or Firm* — The Nath Law Group; Jerald L. Meyer; Derek Richmond

(57) ABSTRACT

The present invention seeks to provide a simple, but novel regime, for re-labelling swappable pins that permits swappability information to be maintained without significantly increasing computational complexity and is conducive to inexact pattern matching for the purposes of developing more complex logical processing blocks from elementary components in design analysis. The method comprises a recursive application of a simple labelling procedure. This method is repeated recursively until all gate instances in the circuit fragment have been assigned a swappability number.

10 Claims, 5 Drawing Sheets

$S(G) = ((A,B),(C,D),E)$

FIGURE 2A
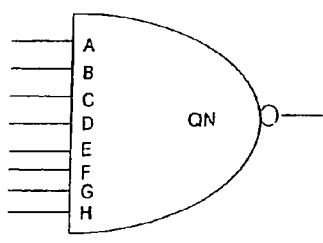
Gate G
S(G) = (([A,B],[C,D]),([E,F],[G,H]))
FIGURE 2B
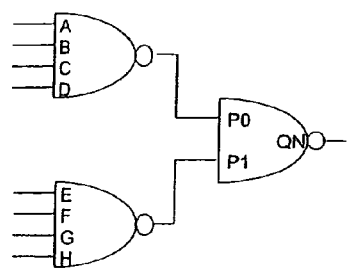
I(P0) = I(P1) = 0
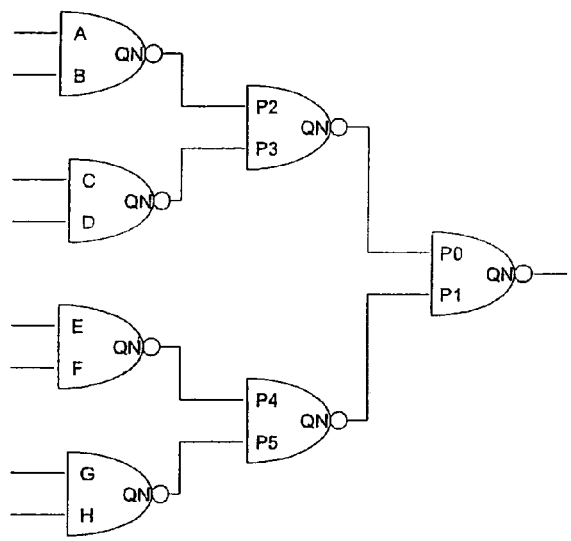
I(P2) = I(P3) = 0; I(P4) = I(P5) = 0        I(A) = 0, I(B) = 1; I(C) = 0, I(D) = 1; I(E) = 0, I(F) = 1; I(G) = 0, I(H) = 1
FIGURE 2C

METHOD OF LABELLING SWAPPABLE PINS FOR INTEGRATED CIRCUIT PATTERN MATCHING

FIELD OF THE INVENTION

The present invention relates to integrated circuit network analysis and more particularly to methods for modelling and recording complex node interchangeability properties.

BACKGROUND TO THE INVENTION

In the intensely competitive field of microelectronics, detailed analysis of a semiconductor integrated circuit (IC) product may provide valuable information as to how a particular technical problem was solved, overall strengths and weaknesses of a design approach and the like. Such information may be used to make decisions relating to market positioning, future designs and new product development. Moreover, the information may constitute evidence of copying that may give rise to patent infringement and/or licensing issues.

Typically, such information is obtained from analysis of the product by means of circuit extraction or reverse engineering, as well as functional analysis and other technical means. At the core of such activity lies the process of design analysis, which, in this context, refers to techniques and methodologies for deriving complete or partial schematics of the product. Nian Zhang et al.'s paper entitled, "The subcircuit extraction problem" IEEE Potentials, August/September 2003, p. 22, provides background information regarding the challenges facing subcircuit extraction, i.e., converting transistor net-lists into gates.

Unlike testing and verification of a known design, design analysis typically does not have the benefit of a known detailed reference.

Heretofore, design analysis typically involved manual extraction of circuit information from a set of large photomosaics of an IC or portion thereof. Photomosaics are high magnification photographs of portions of an IC that are "mosaicked" or stitched together.

With modern advances in image processing and electron microscopy, traditional photomosaic images have largely been replaced by topographical images of the IC die's interconnected metal and semiconductor layers. These topographical images are viewable on computer monitors using dedicated software. For example, one such software is described in U.S. Pat. No. 6,907,583 by Abt et al., entitled "Computer aided method of circuit extraction" and issued on Jun. 14, 2005, which is incorporated by reference herein.

Such software depicts the IC layout as a series of polygons representing the arrangement of the various metal layers, in different colours to differentiate between layers. One or more layers may be selected for viewing apart from non-selected layers when conducting the design analysis, which involves extracting or identifying the circuitry represented on a portion of the IC, a process known as circuit readback.

As most ICs are designed using libraries of components, each of which may comprise a circuit combination of less complex sub-circuits, a significant part of the design analysis process is the extraction and identification of standard cells, that is, known repetitive blocks of electrical components.

Co-pending and commonly assigned U.S. published patent application no. 20060045325, filed Aug. 31, 2004, disclosed by Zavadsky et al., and entitled "Method of Design Analysis of Existing Integrated Circuits" and incorporated by reference herein, describes an automated process of identifying repetitive circuitry from a layout image. However, such method assumes that each sub-circuit has an identical layout, which may not always be the case.

Advances in IC design, as well as a push for ever-smaller ICs, have meant that circuit blocks may now be spread across the entire surface area of the die, in an effort to more efficiently make use of the available space. Moreover, much of the modern IC design is done automatically by auto-routing, with the electrical components being positioned in a space-efficient manner, which may not necessarily constitute a logical or even a visually appealing manner. Furthermore, it is entirely likely that two electrically identical circuits corresponding to a single standard cell will be laid out in different areas of the die and may have entirely different physical layouts.

Nevertheless, even though two circuit blocks on an IC may not be visually similar, they may nevertheless be electrically identical in that they have correspondingly similar electrical connections.

Typically, the circuitry extracted during the design analysis process is represented electronically using a representational format such as a net-list. A net-list is a list of electrical components of a circuit and their interconnections. Each interconnection or "net" is assigned a unique label. A net-list lists each component in the circuit, as well as every net to which each of the terminals of such components is connected. As such, it completely defines the interconnections of the circuit and the schematic diagram thereof could be recreated therefrom.

Thus, even though each instance of repetitive circuitry in an IC layout may be visually or physically different, that portion of the net-list describing an instance of such circuitry, or sub-net-list, should be similar to other instances of the same repetitive circuitry.

Co-pending and commonly assigned U.S. patent application Ser. No. 11/411,593, filed Apr. 26, 2006, by Zavadsky et al. and entitled "Net-List Organization Tools," incorporated by reference herein, discloses a method of organizing circuitry from a net-list of an IC for design analysis purposes, by identifying potential electrically identical elements in the net-list by inexact pattern matching and organizing the net-list into a hierarchy by replacing identified instances with a higher-level representation.

Inexact pattern matching is a mechanism of modelling sub-graph isomorphism, a pattern-matching technique. Isomorphism is defined as something having the "same form" or the "same shape." Two groups of elements are said to be isomorphic if there is a one-to-one relationship between the elements of the first group and the elements of the second group.

Graph isomorphism signifies that two entire graphs, such as a net-list fragment, are identical. Sub-graph isomorphism signifies that there is a one-to-one relationship between each element of a sub-graph of a larger graph and a corresponding sub-graph of another larger graph.

In inexact pattern-matching, a first pattern instance in a circuit design will be recognized as a match for a second pattern instance, even if the instances are not physically or visually identical, as a result of common modifications made by circuit designers and auto-routers, such as by attaching inputs to Vdd or GND or shorting together of inputs.

However, other differences between electrically identical circuit fragments may not be detected by inexact pattern-matching in isolation. These include interchangeable or swappable nodes or pins. A component may be said to have swappable nodes if the component operates identically whether or not a particular circuit fragment is connected to one or another of the swappable nodes.

Typically, such swappability occurs at a terminal point or node (whether an input or an output) of a component, and more typically at input nodes. For example, an n-input NOR gate generates a logical 1 at its output only if there is a logical 0 at each input. As such, the output will not change irrespective of whether a given circuit fragment feeds into one or another of the inputs to the NOR gate. Thus, the n inputs to the NOR gate are said to be interchangeable or swappable, as referred to hereinafter.

As a result of the foregoing, in performing inexact pattern matching, a circuit fragment feeding into a first input in one instance and feeding into a second input in a second instance would be electrically identical. Presumably, inexact pattern matching would pick up the equivalency of such a simple level of swappability.

Some components, however, have much more complex swappability. That is, a component may contain one or more nodes that are swappable with some nodes but not swappable with other nodes. Indeed, groups of nodes, whether swappable or otherwise may be swappable or not swappable with still other nodes or groups of nodes.

Those having ordinary skill in this art will appreciate that as simpler components, such as gates, are built up into more complex components, such as flip-flops, adders and processors, as routinely occurs in ICs, the level of complexity of the swappability of nodes may similarly increase.

While the process of circuit extraction is aimed at simplifying structures and identifying points of similarity, care should be taken to ensure that information that might assist in these objectives at a later point in time is not lost in the process. Complex swappability of nodes may constitute such information.

What is therefore needed is a mechanism to identify and resolve complex swappability relationships in a manner that allows such relationships to be subjected to inexact pattern matching without risk of loss of any of the swappability information.

SUMMARY OF THE INVENTION

An embodiment of the present invention seeks to provide a simple but novel regime for re-labelling swappable pins that permits swappability information to be maintained without significantly increasing computational complexity and is conducive to inexact pattern matching for the purposes of developing more complex logical processing blocks from elementary components in design analysis.

According to a first broad aspect of an embodiment of the present invention, there is disclosed a method of assigning labels to nodes of integrated circuit components to indicate swappability relationships therebetween, the method comprising the steps of: (a) identifying a first gate instance without an assigned label; (b) determining if each input node associated with the identified gate instance has a common swappability characteristic, wherein the common swappability characteristic is chosen from the group consisting of: the node is swappable with any other input node, associated with the identified gate instance, and the node is not swappable with any other input node, associated with the identified gate instance; (c) for each input node associated with the identified gate instance that is swappable with any other input node thereof, creating a common node between the swappable input nodes and linking the common node to the identified gate instance, and assigning each swappable input node a first set of swappability labels; (d) for each input node associated with the identified gate instance that is not swappable with any other input node thereof, assigning each non-swappable input node a second set of swappability labels; (e) repeating all previous steps for each gate instance until no gate instances remain with unassigned labels, such that labeled nodes contain information regarding the swappability of input nodes that is capable of being used for circuit analysis.

According to a second broad aspect of an embodiment of the present invention, there is disclosed a system for assigning labels to nodes of integrated circuit components to indicate swappability relationships therebetween, comprising: a software module for identifying a first gate instance without an assigned label; a software module for determining if each input node associated with the identified gate instance has a common swappability characteristic, wherein the common swappability characteristic is chosen from the group consisting of: the node is swappable with any other input node, associated with the identified gate instance, and the node is not swappable with any other input node, associated with the identified gate instance; a software module, executable for each input node associated with the identified gate instance that is swappable with any other input node thereof, for creating a common node between the swappable input nodes and linking the common node to the identified gate instance, and for assigning each swappable input node a first set of swappability labels; a software module, executable for each input node associated with the identified gate instance that is not swappable with any other input node thereof, for assigning each non-swappable input node a second set of swappability labels; a software module for repeating all previous steps for each gate instance until no gate instances remain with unassigned labels, such that labeled nodes contain information regarding the swappability of input nodes that is capable of being used for circuit analysis.

According to a third broad aspect of an embodiment of the present invention, there is disclosed a computer-readable medium having computer-executable instructions, when executed by a computer, that cause the computer to perform the method of assigning labels to nodes of integrated circuit components to indicate swappability relationships therebetween, the method comprising the steps of: (a) identifying a first gate instance without an assigned label; (b) determining if each input node associated with the identified gate instance has a common swappability characteristic, wherein the common swappability characteristic is chosen from the group consisting of: the node is swappable with any other input node, associated with the identified gate instance, and the node is not swappable with any other input node, associated with the identified gate instance; (c) for each input node associated with the identified gate instance that is swappable with any other input node thereof, creating a common node between the swappable input nodes and linking the common node to the identified gate instance, and assigning each swappable input node a first set of swappability labels; (d) for each input node associated with the identified gate instance that is not swappable with any other input node thereof, assigning each non-swappable input node a second set of swappability labels; (e) repeating all previous steps for each gate instance until no gate instances remain with unassigned labels, such that labeled nodes contain information regarding the swappability of input nodes that is capable of being used for circuit analysis.

According to a fourth broad aspect, there is disclosed a method of assigning labels to nodes of integrated circuit components to indicate swappability relationships therebetween, the method comprising the steps of: (a) identifying a first gate instance without an assigned label; (b)determining which input nodes are swappable with each other; (c) assigning each group of swappable nodes to a common node, and labeling each node within the group with a common label; and (d) labeling each non-swappable node with a unique label.

BRIEF DESCRIPTION OF THE DRAWINGS

The embodiments of the present invention will now be described by reference to the following figures, in which identical reference numerals in different figures indicate identical elements and in which:

FIGS. 2A, 2B, 2C are a second set of exemplary schematic diagrams of a circuit fragment having complex swappability and two notional equivalent circuit of components, with the equivalent circuit of FIG. 2C having trivial swappability complexity.

DETAILED DESCRIPTION OF THE EMBODIMENTS OF THE INVENTION

Figure 1B:
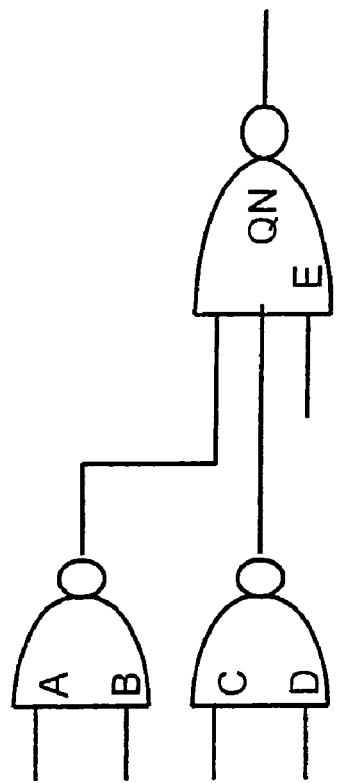
FIGS. 1A, 1B are a first set of exemplary schematic diagrams of a circuit fragment having complex swappability and a notional equivalent circuit of components, each with trivial swappability complexity.

The invention will be described for the purposes of illustration only in connection with certain embodiments; however, it is to be understood that other objects and advantages of the present invention will be made apparent by the following description of the drawings according to the present invention. While a preferred embodiment is disclosed, this is not intended to be limiting. Rather, the general principles set forth herein are considered to be merely illustrative of the scope of the present invention and it is to be further understood that numerous changes may be made without straying from the scope of the present invention.

At the outset, in order to discuss complex swappability, it may be helpful to introduce a notational shorthand, in which swappable inputs are surrounded by round parentheses "( )" while inputs that are not interchangeable are surrounded by square brackets "[ ]." Thus, for example, a swappability relation $S(G)$ for a gate G, expressed as $$S(G)=((A, B), (C, D)) \qquad (1)$$

signifies that nodes A and B of gate G may be swapped, as may nodes C and D. Further, the relation shows that node grouping or sub-expression (A,B) may be swapped with node grouping (C,D). However, neither node C nor node D may be swapped with either of nodes A or B.

Additionally, some principles of swappability may be better illustrated by adopting a number of graph models. Suitable models known to those having ordinary skill in this art include: hypergraphing, bi-partite, and tri-partite graphing. In the present discussion, tri-partite graphing is employed, in which gates are represented by diamonds, nets by squares and pins or nodes are represented by circles.

It may also be helpful to refer to the complexity level of swappability for a component. A trivial expression, in which each node is not swappable with each other node is assigned a swappability complexity of 0. The foregoing simple rule may be applied to a gate instance exhibiting trivial swappability complexity.

In general, an expression $S(G)$ is considered to have a swappability complexity of n+1 if it can be expressed as an expression of swappability complexity of 0, comprising sub-expressions, each of which is has a swappability complexity of n.

Referring now to the present invention, an embodiment thereof recursively invokes a sequential decomposition of each circuit fragment having complex swappability into a notional equivalent circuit with less complex swappability relations, until only instances with trivial swappability complexity remain. For each node p in a circuit fragment, a swappability number $l(p)$ is defined that satisfies the relation $$l(p')=l(p'') \qquad (2)$$

if and only if nodes p' and p" are swappable. If all nodes are not swappable, then all of them would have different swappability numbers $l(p)$.

Because, in the course of the sequential decomposition, equivalence of each circuit is maintained, the final circuit so derived is electrically equivalent to the initial circuit in the sense of its structure of connections, that is, the external connections of notional equivalent sub-circuits are identical to the external connections of the component(s) in the original circuitry. Thus, the completed notional equivalent circuit may be used for further modeling and processing using conventional formal methods, for example, inexact pattern matching for design analysis purposes.

Figure 1A:
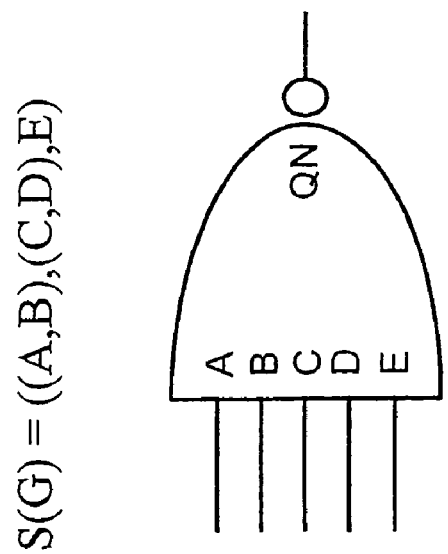

To further explain the present invention, reference is now made to an exemplary circuit fragment in FIG. 1A, having a swappability relation:

$$((A, B), (C, D), E) \qquad (3)$$

and a notional equivalent in FIG. 1B, in which each group of pins have been broken out into a separate notional circuit component each with a simple swappability relation that together provide an equivalent relationship:

$$S(G_1)=(A, B);$$

$$S(G_2)=(C,D);$$

$$S(G_3)=(G_1, G_2, E) \qquad (4)$$

Indeed, there is no difference between the single gate with complex swappability shown in FIG. 1A and the equivalent plurality of gates, each with trivial swappability shown in FIG. 1B.

However, viewed from the perspective of FIG. 1B, it may be easily understood that $$l(QN)=0$$

$$l(A)=l(B)=l(C)=l(D)=1$$

$$l(E)=2 \qquad (5)$$

As such, input nodes A, B, C, and D, are labeled with swappability number "1". Input node E, is labeled with swappability number "2". Output node QN is labeled with swappability number "0".

Figure 1C:
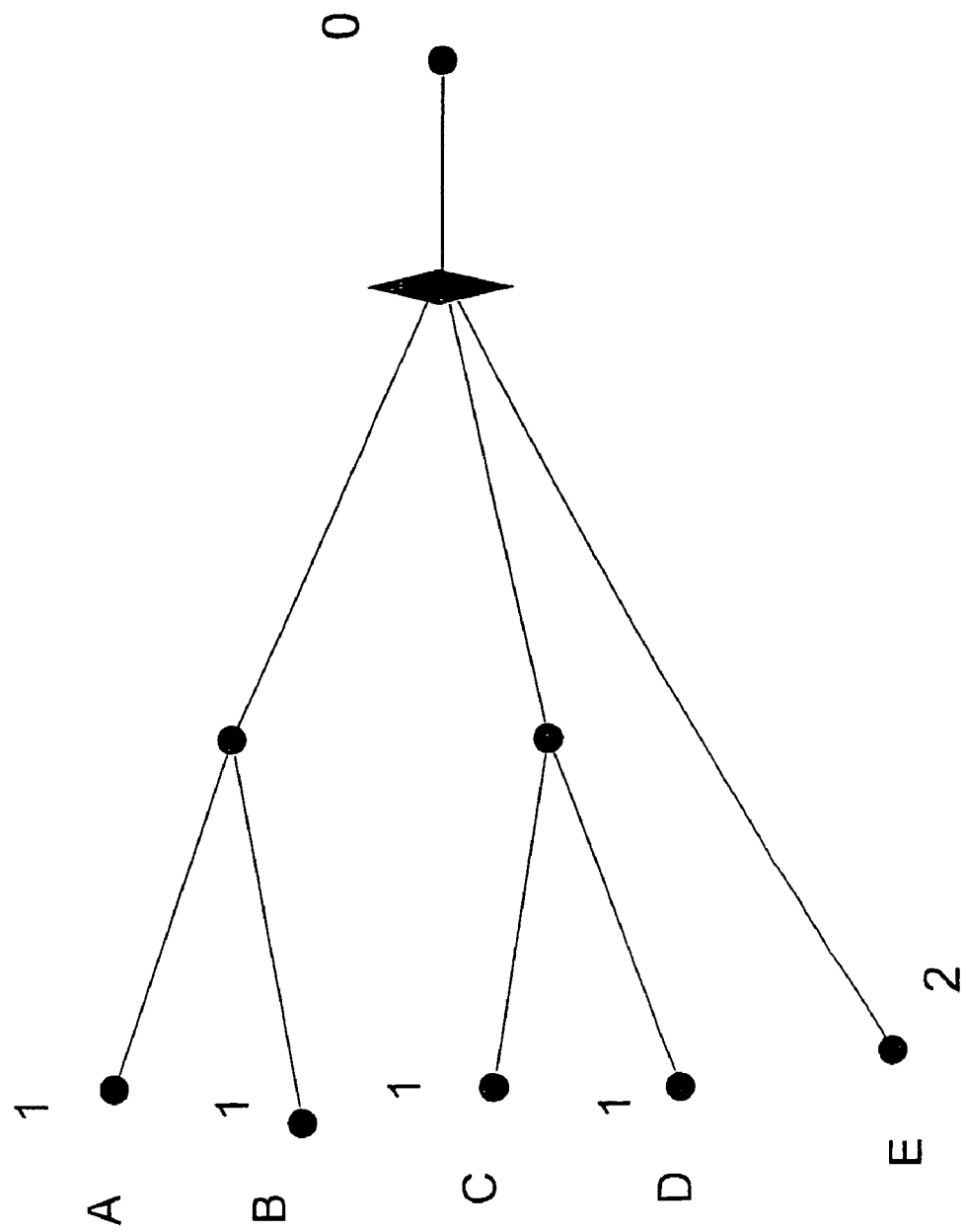
FIG. 1C is a tri-partite graph of the notional equivalent circuit, whereby input nodes are labeled in accordance with an embodiment of the present invention.

FIG. 1C is a tri-partite graph representation of the notional equivalent circuit of FIG. 1B. Here, each input node A, B, C, D, E has been labeled with its respective swappability number, "1" to denote the swappability between input nodes A, B, C, D, and "2" that input node E is not swappable with any other node (or "non-swappable").

Figure 2D:
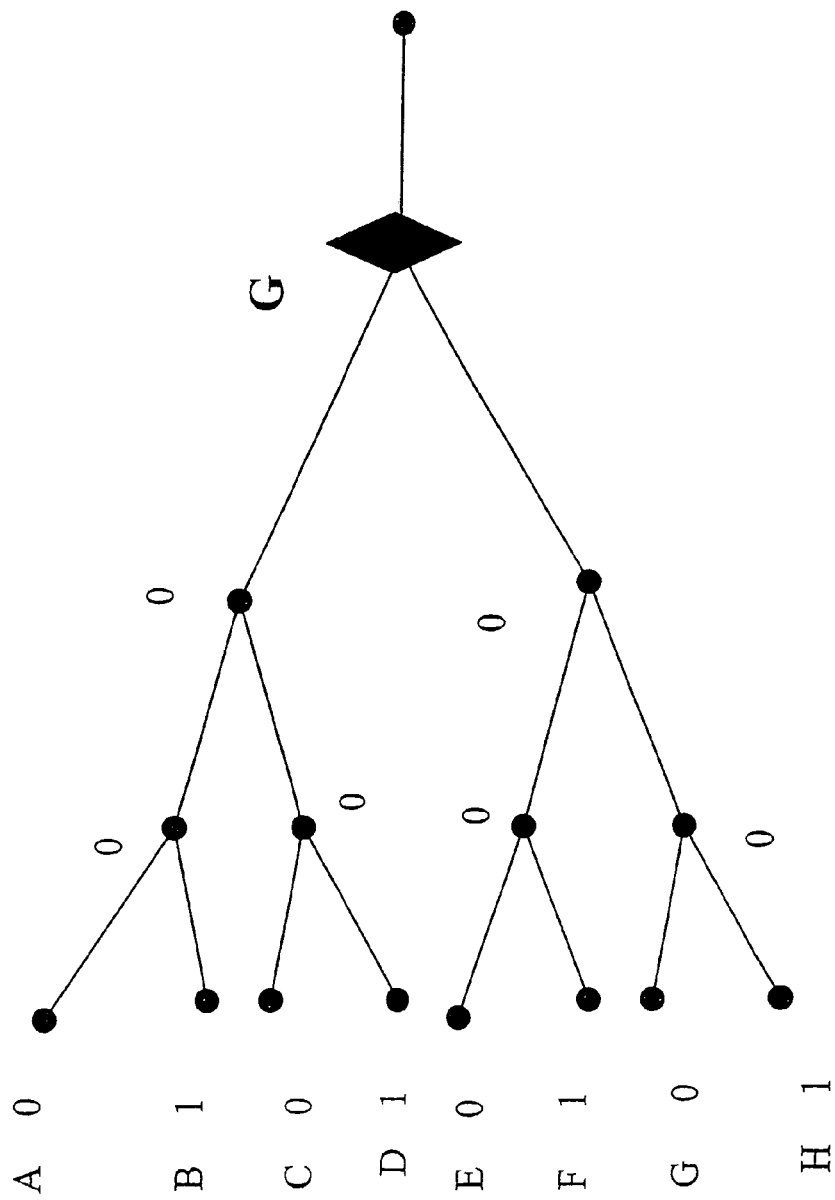
FIG. 2D is a tri-partite graph of the notional equivalent circuit, whereby the input nodes are labeled in accordance with an embodiment of the present invention.

FIGS. 2A, 2B, 2C shows a second set of exemplary schematic diagrams of a circuit fragment having complex swappability and two other notional equivalent circuit, with FIG. 2C showing an equivalent circuit decomposed to its trivial swappability complexity. FIG. 2D shows a tri-partite graph showing nodes labeled according to the swappability rule.

Here, the swappability relation for the exemplary circuit shown in FIG. 2A is: S(G)=(([A,B], [C,D]), ([E,F], [G,H])).

According to an embodiment of the inventive method, because one group of nodes ([A,B],[C,D]) is swappable with another group of nodes ([E,F],[G,H]), the schematic diagram of FIG. 2A is decomposed into a notional equivalent circuit with less complex swappability relations shown at FIG. 2B, whereby input nodes P0 and P1 are labeled with swappability number "0".

After a further decomposition, a notional equivalent circuit with trivial swappability complexity is shown in FIG. 2C. Here, input nodes P2, P3, P4, P5 are labeled with swappability number "0" because of their swappability relation.

However, because node A is not swappable with node B, node C is not swappable with node D, node E is not swappable with node F, and node G is not swappable with node H, each pair of nodes must be labeled differently, such that nodes A and B are labeled 0 and 1, respectively, nodes C and D are labeled 0 and 1, respectively, nodes E and F are labeled 0 and 1, respectively, and nodes G and H are labeled 0 and 1, respectively.

FIG. 2D is a tri-partite graph representation of the notional equivalent circuit of FIG. 2C, to show how the nodes are labeled in accordance with the swappability relation of S(G)=(([A,B], [C,D], ([E,F],[G,H])).

Figure 3:
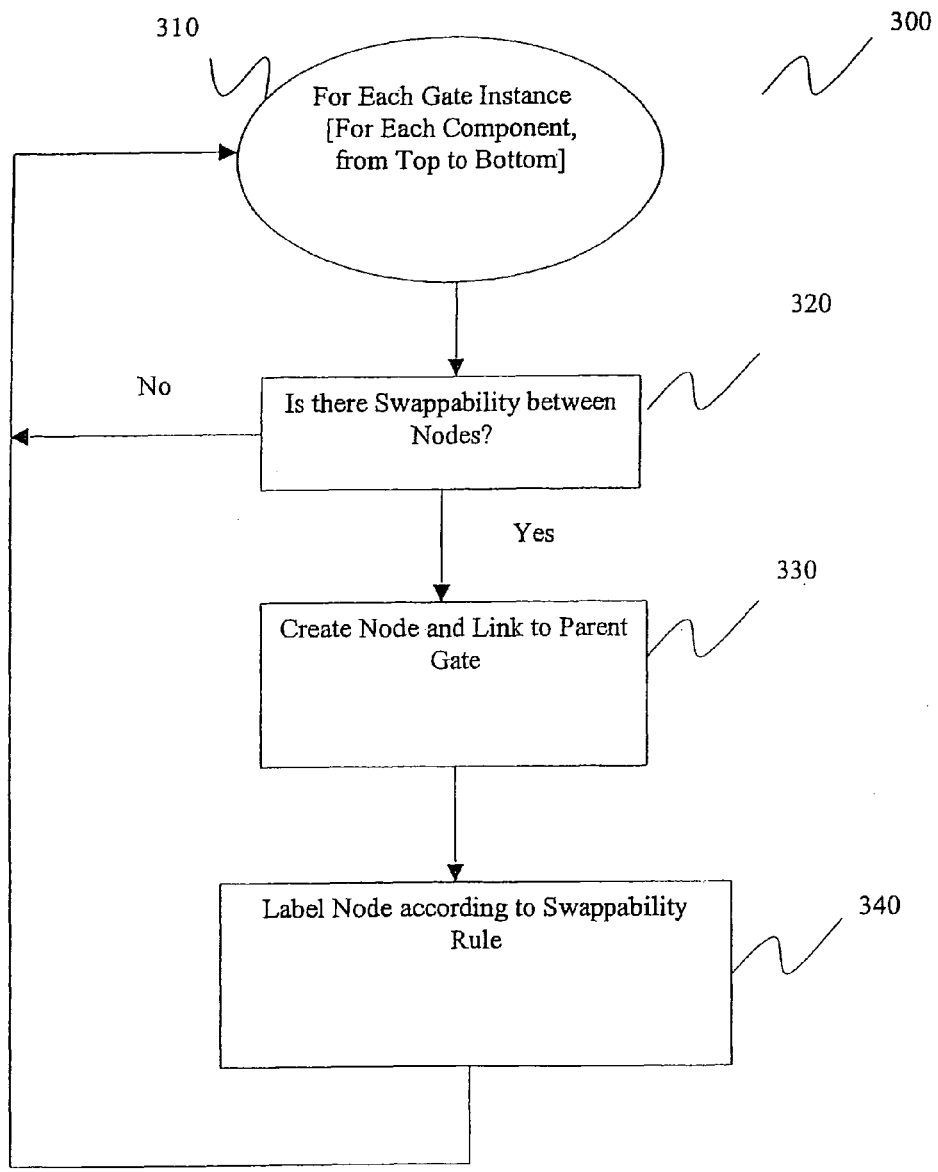
FIG. 3 is a flow chart detailing the methods for labeling nodes having a swappability relation in accordance with an embodiment of the present invention.

FIG. 3 is a flow chart 300 detailing the processing steps for a complex swappability relation in accordance with an embodiment of the present invention. Upon startup, a search is conducted for each gate instance at step 310, whereby each component of each gate instance is analyzed from top to bottom. Next, at step 320, each gate instance is analysed to determine whether it exhibits trivial swappability complexity, that is, whether its swappability complexity is 0.

According to step 330, if the swappability complexity of the gate instance is 0, it is further analysed to determine whether nodes of the gate instance are swappable. If the nodes of the gate instance are swappable, a common node is created between the swappable nodes and then linked to the gate instance (or parent gate). Next, according to step 340, the input nodes are then assigned a common swappability number 340. If the nodes of the gate instance are not swappable, they are each assigned different swappability numbers 340, in accordance with the rule set for expressions of trivial swappability complexity.

Thereafter, with each iteration of the process, a search is conducted for another gate instance that has not been assigned a swappability number. It is only when no further gate instances remain without a swappability number l(p) assigned, that the processing concludes.

Once the process steps of flowchart 300 has completed at least a first iteration, the original gate instance having complex swappability has been replaced by a notional equivalent circuit structure comprised only of gates having trivial swappability, each of which has been assigned a swappability number, which circuit structure may be employed in place of the original gate instance in any circuit analysis such as inexact pattern matching for design analysis purposes.

It should also be readily understood that the process can be readily applied to groups of nodes that have a common swappability characteristic between them, such that a swappability label is assigned to them to identify the common swappability between the groups of nodes.

Embodiments of the invention may be implemented in any conventional computer programming language. For example, preferred embodiments may be implemented in a procedural programming language (e.g., "C") or an object oriented language (e.g., "C++"). Alternative embodiments of the invention may be implemented as pre-programmed hardware elements, other related components, or as a combination of hardware and software components.

Embodiments can be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques).

The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device., such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server over the network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

The present invention can also be implemented in digital electronic circuitry, or in computer hardware, firmware, software, or in combination thereof. Embodiments of the invention can be implemented in a computer program product tangibly embodied in a machine-readable storage device for execution by a programmable processor; and methods can be performed by a programmable processor executing a program of instructions to perform functions of the invention by operating on input data and generating output. The invention can be implemented advantageously in one or more computer programs that are executable on a programmable system including at least one input device, and at least one output device. Each computer program can be implemented in a high-level procedural or object oriented programming language, or in assembly or machine language if desired; and in any case, the language can be a compiled or interpreted language.

Suitable processors include, by way of example, both general and specific microprocessors. Generally, a processor will receive instructions and data from a read-only memory and/or a random access memory.

Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; CD-ROM disks; and buffer circuits such as latches and/or flip flops. Any of the foregoing can be supplemented by, or incorporated in ASICs (application-specific ICs), FPGAs (field-programmable gate arrays) or DSPs (digital signal processors).

The system embodying the invention may comprise a processor, a random access memory, a hard drive controller, and an input/output controller coupled by a processor bus.

It will be apparent to those skilled in this art that various modifications and variations may be made to the embodiments disclosed herein, consistent with the present invention, without departing from the spirit and scope of the present invention.

Other embodiments consistent with the present invention will become apparent from consideration of the specification and the practice of the invention disclosed therein. Accordingly, the specification and the embodiments are to be considered exemplary only, with a true scope and spirit of the invention being disclosed by the following claims.

What is claimed is:

1. A method of assigning labels to nodes of integrated circuit components to indicate swappability relationships between the nodes, the method comprising the steps of:
   (a) identifying a first gate instance without an assigned label;
   (b) determining if each input node associated with the identified gate instance has a common swappability characteristic, wherein the common swappability characteristic is chosen from the group consisting of: the node is swappable with any other input node, associated with the identified gate instance, and the node is not swappable with any other input node, associated with the identified gate instance;
   (c) for each input node associated with the identified gate instance that is swappable with any other input node thereof, creating a common node between the swappable input nodes and linking the common node to the identified gate instance, and assigning each swappable input node a first set of swappability labels, using a computer;
   (d) for each input node associated with the identified gate instance that is not swappable with any other input node thereof, assigning each non-swappable input node a second set of swappability labels; and
   (e) repeating all previous steps for each gate instance until no gate instances remain with unassigned labels, such that labeled nodes contain information regarding the swappability of input nodes that is used for circuit analysis.

2. A method as in claim 1, wherein steps (b) through (d) are performed for groups of nodes that have a common swappability characteristic between them, wherein a swappability label is assigned to them to identify the common swappability between the groups of nodes.

3. A method of assigning labels according to claim 1, wherein the first set of swappability labels comprises a single label.

4. A method of assigning labels according to claim 1, where the second set of swappability labels are all different.

5. A method of assigning labels according to claim 1, wherein swappability labels are reused for different gate instances.

6. A method of assigning labels according to claim 1, wherein each output node associated with a gate instance is assigned a swappability label that is different from those assigned to the input nodes associated therewith.

7. A method of assigning labels according to claim 6, wherein if an output node associated with a gate instance is swappable with another output node associated therewith, the swappability labels assigned thereto are the same.

8. A method of assigning labels according to claim 6, wherein if an output node associated with a gate instance is not swappable with another output node associated therewith, the swappability labels assigned thereto are different.

9. A system for assigning labels to nodes of integrated circuit components to indicate swappability relationships between the nodes, the system comprising a computer and a computer-accessible memory storing instructions for execution by the computer, the instructions comprising:
   a software module for identifying a first gate instance without an assigned label;
   a software module for determining if each input node associated with the identified gate instance has a common swappability characteristic, wherein the common swappability characteristic is chosen from the group consisting of: the node is swappable with any other input node, associated with the identified gate instance, and the node is not swappable with any other input node, associated with the identified gate instance;
   a software module, executable for each input node associated with the identified gate instance that is swappable with any other input node thereof, for creating a common node between the swappable input nodes and linking the common node to the identified gate instance, and for assigning each swappable input node a first set of swappability labels;
   a software module, executable for each input node associated with the identified gate instance that is not swappable with any other input node thereof, for assigning each non-swappable input node a second set of swappability labels; and
   a software module for repeating all previous steps for each gate instance until no gate instances remain with unassigned labels, such that labeled nodes contain information regarding the swappability of input nodes that is used for circuit analysis.

10. A non-transitory computer-readable medium having computer-executable instructions, when executed by a computer, that cause the computer to perform the method of claim 1.

* * * * *